(12) United States Patent
Collins et al.

(10) Patent No.: US 8,674,423 B2
(45) Date of Patent: Mar. 18, 2014

(54) SEMICONDUCTOR STRUCTURE HAVING VIAS AND HIGH DENSITY CAPACITORS

(75) Inventors: David S. Collins, Williston, VT (US); Kai D. Feng, Hopewell Junction, NY (US); Zhong-Xiang He, Essex Junction, VT (US); Peter J. Lindgren, Essex Junction, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/302,168

(22) Filed: Nov. 22, 2011

(65) Prior Publication Data

US 2012/0061801 A1  Mar. 15, 2012

Related U.S. Application Data

(62) Division of application No. 12/191,379, filed on Aug. 14, 2008, now Pat. No. 8,101,494.

(51) Int. Cl.
*H01L 27/108* (2006.01)

(52) U.S. Cl.
USPC ............ 257/301; 257/534; 257/E29.343

(58) Field of Classification Search
USPC .................... 257/301, 534, E29.343
See application file for complete search history.

(56) References Cited

U.S. PATENT DOCUMENTS

| | | | |
|---|---|---|---|
| 5,907,782 A | 5/1999 | Wu | |
| 5,930,639 A | 7/1999 | Schuele et al. | |
| 6,093,600 A * | 7/2000 | Chen et al. | 438/243 |
| 6,100,135 A | 8/2000 | Wu | |
| 6,249,017 B1 * | 6/2001 | Togo | 257/301 |
| 6,320,244 B1 | 11/2001 | Alers et al. | |
| 6,346,454 B1 | 2/2002 | Sung et al. | |
| 6,452,251 B1 | 9/2002 | Bernstein et al. | |
| 6,898,068 B2 | 5/2005 | Rost et al. | |
| 6,924,208 B2 | 8/2005 | Rost et al. | |
| 6,946,321 B1 | 9/2005 | Yegnashankaran et al. | |
| 7,112,504 B2 | 9/2006 | Hsin et al. | |
| 8,378,405 B2 * | 2/2013 | Houston | 257/306 |
| 2002/0130388 A1 * | 9/2002 | Stamper | 257/532 |
| 2002/0185671 A1 | 12/2002 | Kim | |
| 2004/0087098 A1 | 5/2004 | Ng et al. | |
| 2004/0115946 A1 | 6/2004 | Hall | |
| 2004/0175883 A1 | 9/2004 | Kim | |
| 2005/0023664 A1 * | 2/2005 | Chudzik et al. | 257/678 |
| 2005/0063138 A1 | 3/2005 | Rost et al. | |
| 2005/0063139 A1 | 3/2005 | Rost et al. | |
| 2005/0087838 A1 * | 4/2005 | Hsin et al. | 257/532 |
| 2007/0040201 A1 * | 2/2007 | Su et al. | 257/301 |
| 2007/0152258 A1 | 7/2007 | Kim | |
| 2007/0278619 A1 | 12/2007 | Clevenger et al. | |
| 2008/0142863 A1 | 6/2008 | Shibata | |
| 2008/0173993 A1 * | 7/2008 | Andry et al. | 257/678 |
| 2008/0268605 A1 | 10/2008 | Ahn et al. | |

* cited by examiner

*Primary Examiner* — Kimberly Rizkallah
*Assistant Examiner* — Duy T Nguyen
(74) *Attorney, Agent, or Firm* — Anthony Canale; Roberts Mlotkowski Safran & Cole, P.C.

(57) ABSTRACT

A method of making a semiconductor structure includes forming at least a first trench and a second trench having different depths in a substrate, forming a capacitor in the first trench, and forming a via in the second trench. A semiconductor structure includes a capacitor arranged in a first trench formed in a substrate and a via arranged in a second trench formed in the substrate. The first and second trenches have different depths in the substrate.

18 Claims, 13 Drawing Sheets

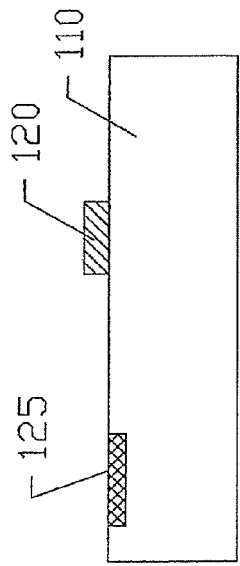
FIG. 13
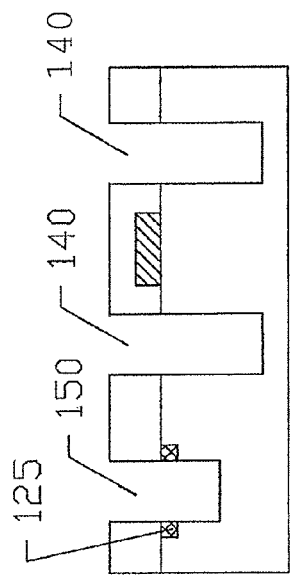
FIG. 15
FIG. 12
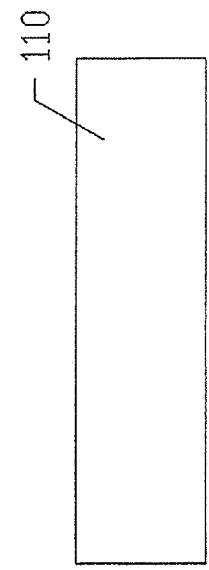
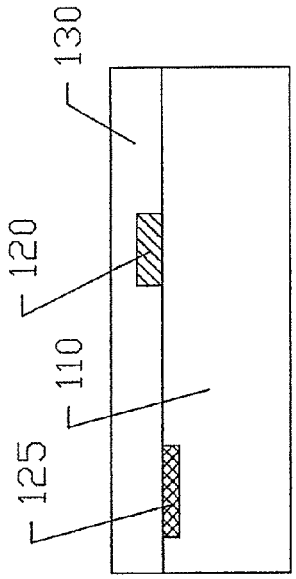
FIG. 14

SEMICONDUCTOR STRUCTURE HAVING VIAS AND HIGH DENSITY CAPACITORS

CROSS REFERENCE TO RELATED APPLICATIONS

This application is a divisional application of U.S. application Ser. No. 12/191,379, filed on Aug. 14, 2008, now U.S. Pat. No. 8,101,494, which is related to U.S. application Ser. No. 12/191,385, filed on Aug. 14, 2008, now U.S. Pat. No. 8,125,013, the contents of which are incorporated by reference herein in their entirety.

FIELD OF THE INVENTION

The invention generally relates to a design structure, and more particularly, to a structure, design structure and method of manufacturing a structure or semiconductor device having vias and high density capacitors which are formed substantially at the same time and/or substantially simultaneously.

BACKGROUND

Passive elements such as inductors, resistors, and capacitors are essential parts in any RF wireless circuit. A capacitor is an electrical/electronic device that can store energy in the electric field between a pair of conductors (called "plates"). The process of storing energy in the capacitor is known as "charging", and involves electric charges of equal magnitude, but opposite polarity, building up on each plate. Capacitors are often used in electric and electronic circuits as energy-storage devices. They can also be used to differentiate between high-frequency and low-frequency signals. This property makes them useful in electronic filters.

Large capacitors are particularly needed for decoupling purposes in order to satisfy power supply requirements and/or minimize signal noise. Typically, a large area is required (about $10^6$ um$^2$) to produce a nano-farad capacitor with current on-chip capacitor capability. However, high value capacitors are difficult to manufacture on-chip. As a result, it is often the case that surface mount capacitors are utilized instead. This is because surface mount capacitors minimize packaging costs relative to high value capacitors.

Accordingly, there exists a need in the art to overcome the deficiencies and limitations described hereinabove.

SUMMARY

In a first aspect of the invention, there is provided a method of making a semiconductor structure, that includes forming at least a first trench and at least a second trench in a substrate and having different depths. The method further includes forming a capacitor in the first trench and forming a via in the second trench.

In a second aspect of the invention, there is provided a method of making a semiconductor structure, comprising forming a capacitor in a first trench formed in a substrate and forming a via in a second trench formed in the substrate. The first and second trenches have different depths in the substrate.

In a third aspect of the invention, there is provided a method of making a semiconductor structure, comprising forming at least a first trench at a first depth in a substrate. The method further includes forming at least a second trench at a second greater depth in the substrate, forming a capacitor in the first trench, and forming a via in the second trench.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 12 shows a substrate for another semiconductor structure according to the invention;

FIG. 13 shows a device and a doped region formed on the substrate of FIG. 12 according to the invention;

FIG. 14 shows a dielectric layer formed over the structure of FIG. 13 according to the invention;

FIG. 15 shows trenches formed in the structure of FIG. 14 according to the invention;

DETAILED DESCRIPTION

It would be advantageous to fabricate high value capacitors with lower costs so that they can be used more readily for decoupling purposes in order to, among other things, satisfy power supply requirements and/or minimize signal noise.

The invention is directed to a design structure, method and structure or semiconductor device having vias and one or more high (defined as greater than about 100 fF/$\mu m^2$) density capacitors which are formed substantially at the same time and/or substantially simultaneously, as well as a method of making a structure or semiconductor device having vias and one or more high density capacitors formed substantially simultaneously.

The invention is also directed to a method of performing a thru wafer via process on trenches that have different sizes such that, during the same thru wafer via process, a first trench is formed which terminates within the substrate while a second trench is formed extending entirely through the substrate. A capacitor is formed within the first trench and a through wafer via is formed in the second trench.

FIGS. 1-11 show an exemplary semiconductor structure and method of making the structure which produces one or more high density capacitors and one or more vias essentially at the same time. Because the capacitors are formed at essentially the same time as the vias, the cost of using and/or making high density capacitors in the structure is reduced.

Figure 1:
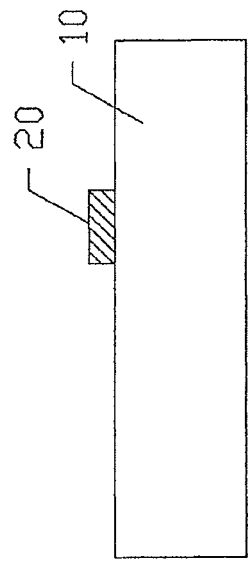
FIG. 1 shows a substrate for a semiconductor structure according to the invention.

With reference to FIG. 1, there is shown a substrate 10. The substrate 10 can be any material typically used in wafer manufacturing such as, for example, Si, SiGe, SiC, SiGeC, etc. The substrate 10 may be fabricated using techniques well know to those skilled in the art. The substrate 10 may also have any desired thickness based upon the intended use of the final semiconductor structure and can be between about 50 um and about 300 um.

Figure 2:
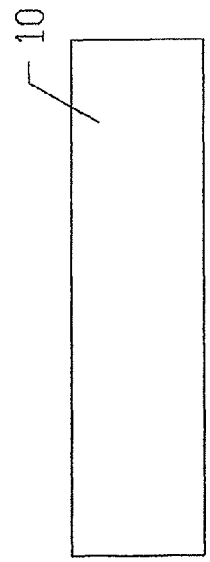
FIG. 2 shows a device formed on the substrate of FIG. 1 according to the invention.

With reference to FIG. 2, there is shown at least one device 20 formed on the substrate 10. The device 20 can be any type of device typically formed on a substrate such as, for example, a transistor, an NPN, a FET (nFET or pFET), a RF wireless circuit device, etc. Any of the typical processes used to form such devices can be utilized to form the device 20.

Figure 3:
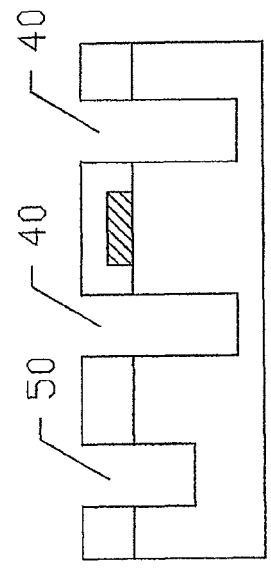
FIG. 3 shows a dielectric layer formed over the structure of FIG. 2 according to the invention.

With reference to FIG. 3, a dielectric and/or isolation layer 30 is formed over the device 20 and substrate 10. The layer 30 can be of any material typically formed over devices and in areas which will receive trenches that form structures such as vias. By way of non-limiting example, the material for the layer 30 is a glass such as Borophosphosilicate glass (BPSG), and is applied by techniques such as chemical vapor deposition (CVD). The layer 30 is preferably applied and/or formed to a thickness of between about 2,000 Å (angstroms) and about 10,000 Å. The layer 30 also functions to, among other things, protect the device 20 (and regions thereof) from downstream processing such as etching and/or trench formation.

Figure 4:
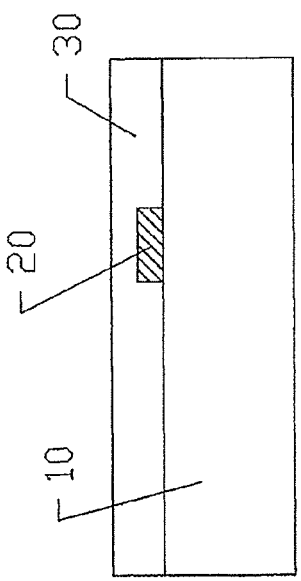
FIG. 4 shows trenches formed in the structure of FIG. 3 according to the invention.

With reference to FIG. 4, deep trenches or holes 40 and shallow trenches or holes 50 are formed in the dielectric layer 30 and substrate 10. The deeper trenches 40 will form vias, and are therefore made deeper than the shallow trenches 50 that will form capacitors. By way of non-limiting example, the depth of the capacitor trench 50 can be between about 50% and about 75% as deep as the via trenches 40. Preferably, a significant amount of substrate remains under the shallow trenches 50 so that when the structure receives a backside metal layer, this portion of the substrate will prevent electrical contact (and/or provide electrical insulation) between the capacitor and the backside metal layer.

The trenches 40 and 50 can be formed using any known trench forming techniques, but are preferably formed at substantially the same time and/or using one or two process steps, i.e., trenches 40 and 50 are preferably formed in the same etching or process steps. Such techniques typically include using one ore more masking and etching steps. In order to form the trenches 40 and 50 so as to have different depths, a mask having smaller openings can be used to form the trenches 50, whereas larger openings can be used to form trenches 40. By way of non-limiting example, the width or opening diameter of the openings which will form the trenches 50 can preferably be between about 2 microns and about 20 microns, whereas the width or opening diameter of the openings which will form the trenches 40 can preferably be between about 3 microns and about 30 microns.

Figure 5:
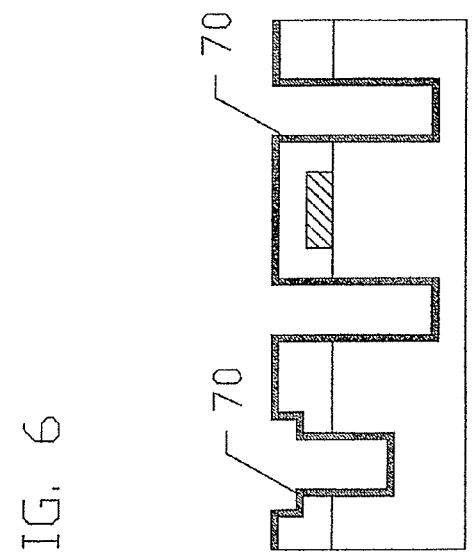
FIG. 5 shows a recess formed in the shallow trench of the structure of FIG. 4 according to the invention.

With reference to FIG. 5, a recess or pedestal trench 60 can be formed in the trenches 50 which will form the capacitor(s). The recess 60 is formed in the layer 30 and is preferably formed using another etching step or process. Such techniques typically include using one or more masking and etching steps. In order to form the recess 60, a photolithographic mask is used to prevent unwanted etching of the trenches 40 and 50. By way of non-limiting example, the width or opening diameter of the recess 60 can preferably be between about 4 microns and about 30 microns, whereas the depth of the recess can preferably be between about 0.5 microns and about 2 microns.

Figure 6:
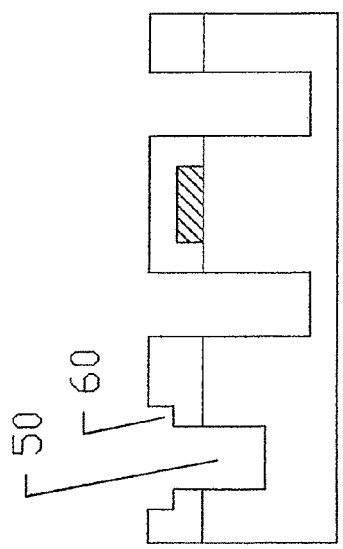
FIG. 6 shows the structure of FIG. 5 after a first conductive film is formed in the trenches according to the invention.

With reference to FIG. 6, a first conductive or metal film 70 is formed in the trenches 40 and 50. The film 70 can be a material such as, for example, TiN, TaN, W, and Ta, and is preferably formed using an atomic layer deposition (ALD) process. Such techniques typically include using one or more masking and deposition steps. By way of non-limiting example, the thickness of the first metal film 70 can preferably be between about 1000 Å (angstroms) and about 5,000 Å.

Figure 7:
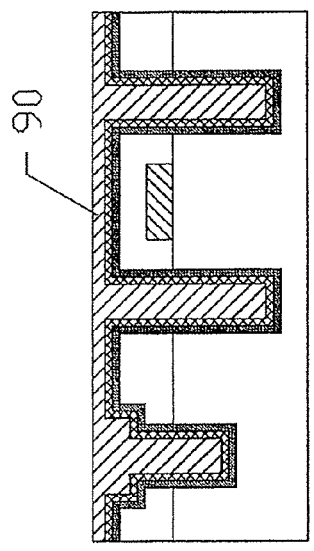
FIG. 7 shows the structure of FIG. 6 after a dielectric film is formed in the trenches according to the invention.

With reference to FIG. 7, a dielectric film 80 is then formed in the trenches 40 and 50 over the film 70. The film 80 can be a material such as, for example, $Si_3N_4$, $Al_2O_3$, $HfO_2$, $Ta_2O_5$, and is preferably formed using an ALD or a CVD process. By way of non-limiting example, the thickness of the dielectric film 80 can preferably be between about 100 Å (angstroms) and about 500 Å or less.

Figure 8:
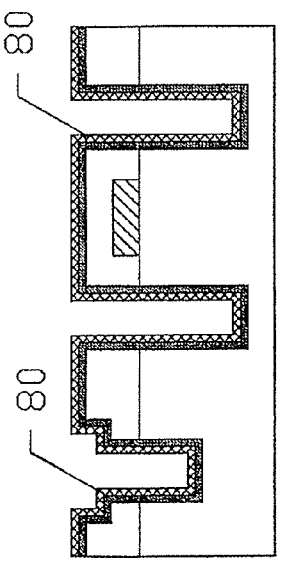
FIG. 8 shows the structure of FIG. 7 after a second conductive film is formed in the trenches according to the invention.

With reference to FIG. 8, a second conductive or metal film 90 is then formed in the trenches 40 and 50 over the film 80. The film 90 can be a material such as, for example, TiN, TaN, W, and Ta, and is preferably formed using a CVD process. By way of non-limiting example, the second metal film 90 preferably substantially or completely fills the trenches 40 and 50 and can be applied to a thickness over layer 30 of a few microns or less. The invention contemplates using the same mask to form the three films 70, 80 and 90, although this will likely require different process tools or processing steps.

Figure 9:
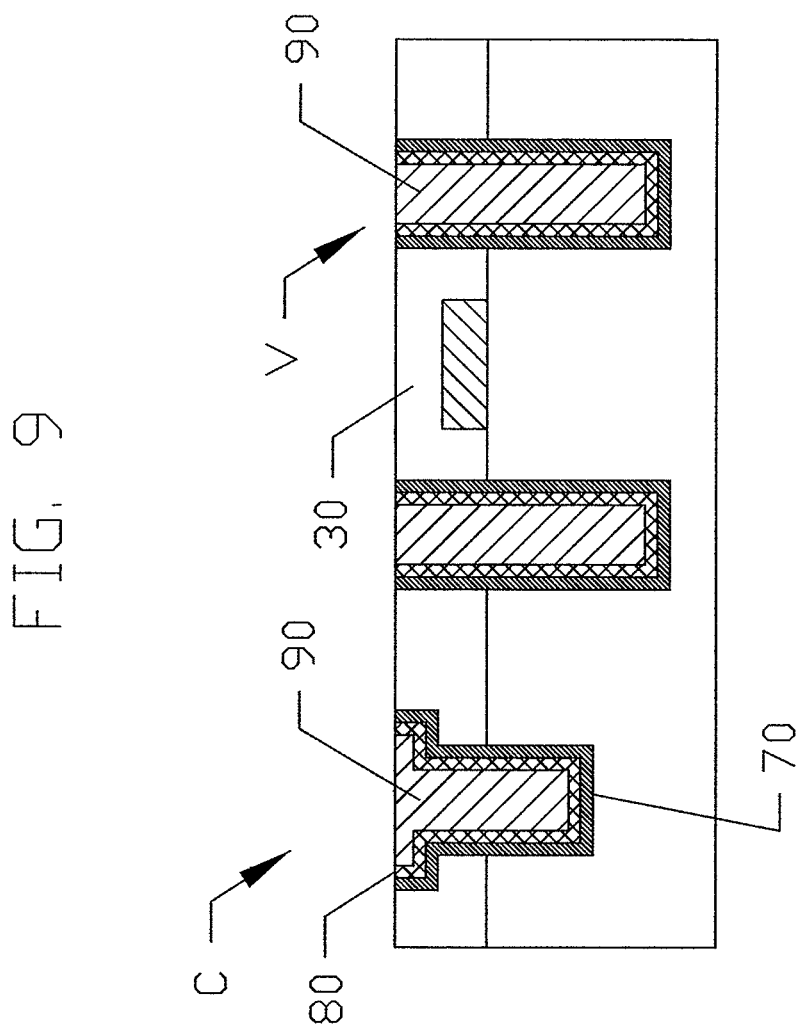
FIG. 9 shows the structure of FIG. 8 after the upper or front side surface of the structure is polished to form the vias and a capacitor according to the invention.

With reference to FIG. 9, the front side of the structure of FIG. 8 is then subjected to a material removing step, e.g., a polishing step, which removes the metal film 90 over the layer 30. The polishing can also remove an upper surface portion of the layer 30. At this point, a capacitor C and vias V are formed. The vias V may be a through wafer via (TWV). The capacitor can be a MIM capacitor or a high density capacitor. By way of non-limiting example, the thickness of the layer 30 which remains after polishing can preferably be between about 2,000 Å (angstroms) and about 10,000 Å.

Figure 10:
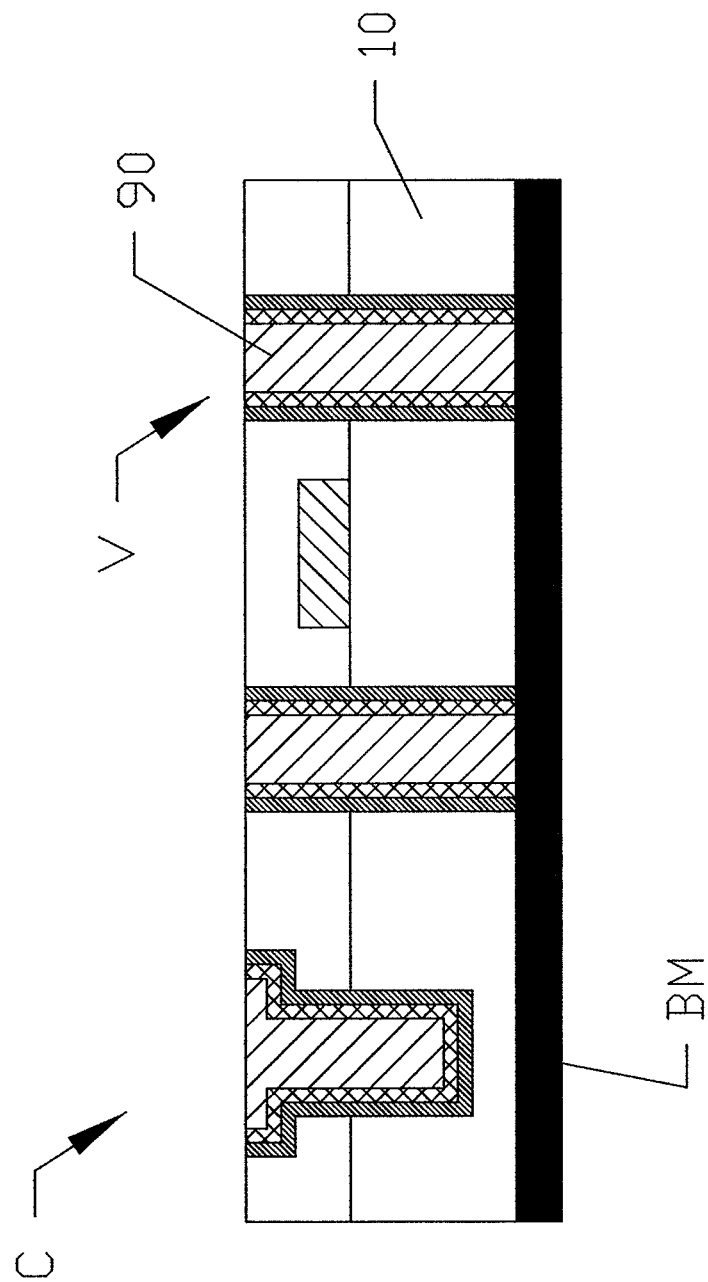
FIG. 10 shows the structure of FIG. 9 after a the back surface of the structure is ground and after a backside metal layer is applied thereto according to the invention.

With reference to FIG. 10, the back side of the structure of FIG. 9 is subjected to a material removing step, e.g., a grinding step, which removes an amount of the substrate 10. A back side metal layer BM is then applied thereto. As a result, the vias V become electrically connected to the back side metal layer BM, while the capacitor C remains electrically insulated therefrom. The layer BM can be a barrier layer and is preferably a material such as, for example, aluminum, nickel, gold, copper, and tungsten. By way of non-limiting example, the spacing or thickness of the substrate 10 between the layer BM and the first metal film of the capacitor C can preferably be between about 10 microns and about 30 microns. The structure in FIG. 10 can then be subjected to further processing steps in order to form a completed semiconductor structure. Such processing will then typically provide electrical connections between the capacitor C and vias V and structures which will be formed over the layer 30.

As is apparent from FIG. 10, the vias V formed according to the invention include a metal film and a dielectric film surrounding the via metal 90. These films do not adversely affect the function of the vias V. Furthermore, because these films are formed at the same time as the corresponding films of the capacitor C, the additional processing costs involved in forming such films in the vias V is minimal, and are offset by the advantageous provided by using capacitors in the structure.

Figure 11:
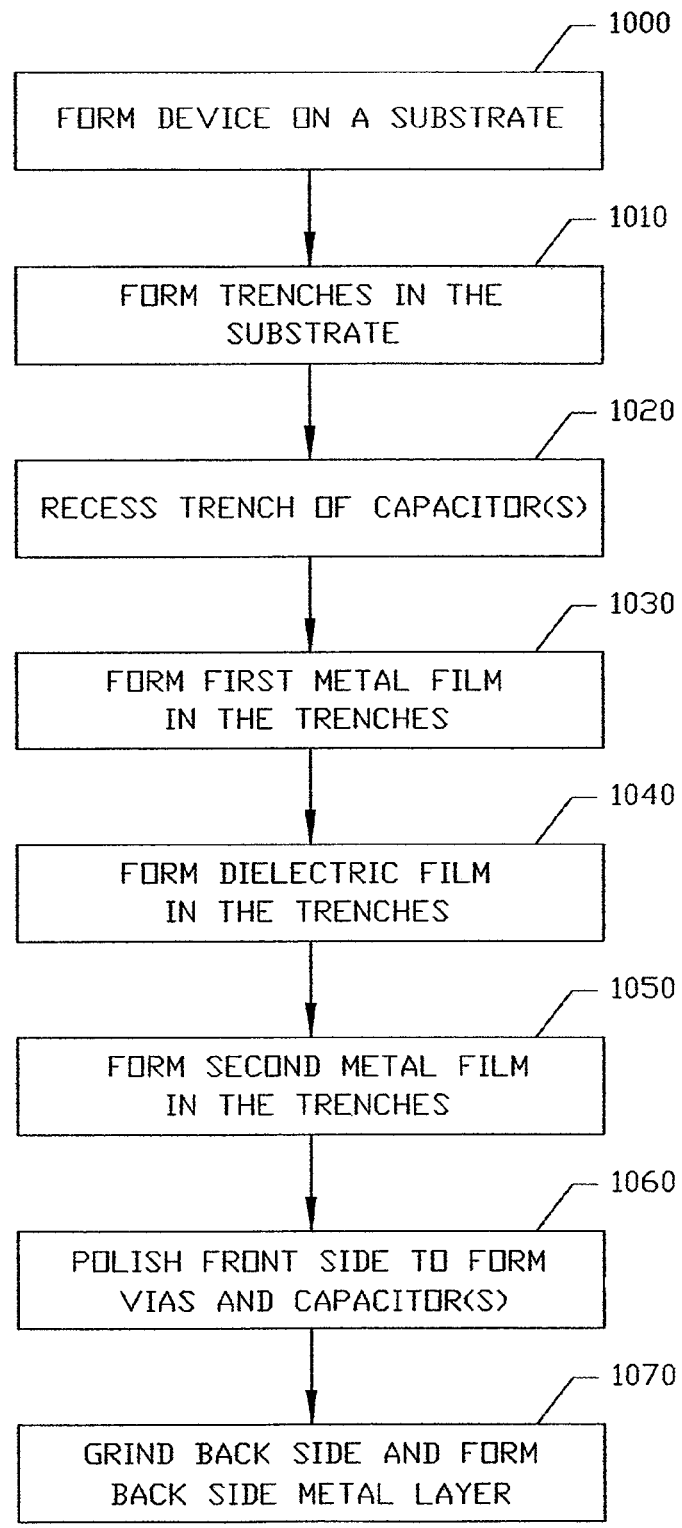
FIG. 11 shows a flow diagram illustrating a non-limiting method of making a semiconductor structure of FIGS. 1-10 according to the invention.

With reference to FIG. 11, there is shown a non-limiting method of making a semiconductor structure of FIGS. 1-10 which includes the step of forming a device on a substrate in step 1000 (see also FIG. 2). Trenches are then formed in the structure which extend into the substrate in step 1010 (see also FIG. 4). This is followed by forming a recess in the shallow trench in step 1020 (see also FIG. 5). Thereafter, a first metal film is formed in the trenches in step 1030 (see also FIG. 6). Then, a dielectric film is formed in the trenches over the first metal film in step 1040 (see also FIG. 7). This is followed with a second metal film being formed in the trenches over the dielectric film in step 1050 (see also FIG. 8). Next, the front side of the structure is polished so as to form the capacitor and the vias in step 1060 (see also FIG. 9). Finally, the back side of the structure is ground and a back side metal layer is applied thereto in step 1070 (see also FIG. 10).

FIGS. 12-22 shows another exemplary semiconductor structure and method of making the structure which produces one or more high density capacitors and one or more vias essentially at the same time. Again, because the capacitors are formed at essentially at the same time as the vias, the cost of using and/or making high density capacitors in the structure is reduced. However, the process of making this embodiment requires an additional mask.

With reference to FIG. 12, there is shown a substrate 110. The substrate 110 can be similar to substrate 10 discussed above such as, for example, Si, SiGe, SiC, SiGeC, etc. The substrate 110 may be fabricated using techniques well know to those skilled in the art and may also have any desired thickness based upon the intended use of the final semiconductor structure.

With reference to FIG. 13, at least one device 120 is formed on the substrate 110. The device 120 can be any type of device typically formed on a substrate as discussed above with reference to FIG. 2. At least one doped region 125 is also preferably formed on the substrate 110. The region 125 can be any type of doped region typically formed on a substrate which functions to conduct electricity and/or as a capacitor electrode such as, arsenic doped n-Well or boron doped p-Well. Any of the typical processes used to form such regions can be utilized to form the region 125 such as ion implantation. The region 125 is preferably formed with a depth of between about 1 micron and about 5 microns. Different masks are likely required to form the device 120 and the region 125 so that these devices will likely be formed in or at different process steps.

With reference to FIG. 14, a dielectric layer 130 is formed over the device 120, the region 125, and the substrate 110. The layer 130 can be of any material typically formed over devices and in areas which will receive trenches that form structures such as vias as discussed in reference to FIG. 3. Again, the layer 130 also functions to, among other things, protect the device 120 (and regions thereof) and the region 125 from downstream processing such as etching and/or trench formation.

With reference to FIG. 15, deep trenches or holes 140 and shallow trenches or holes 150 are formed in the dielectric layer 130 and substrate 110. The deeper trenches 140 will form vias, and are therefore made deeper than the shallow trenches 150 that will form capacitors. The shallow trench 150 is also formed in the doped region 125 so as to provide a conductive path to the capacitor that will be formed in the trench 150. By way of non-limiting example, the depth of the capacitor trench 150 can be between about 50% and about 75% as deep as the via trenches 140. Preferably, a significant amount of substrate remains under the shallow trench(s) 150 so that when the structure receives a backside metal layer, this portion of the substrate will prevent electrical contact (and/or provide electrical insulation) between the capacitor and the backside metal layer.

The trenches 140 and 150 can be formed in the same way as was discussed above with regard to FIG. 4, i.e., using any known via trench forming techniques, but are preferably formed at substantially the same time and/or using the same process step. Thus, trenches 140 and 150 are preferably formed in the same etching step or process. Again, in order to form the trenches 140 and 150 so as to have different depths, a mask having smaller openings can be used to form the trenches 150, whereas larger openings can be used to form trenches 140. As in the previous embodiment, the width or opening diameter of the openings which will form the trenches 150 can preferably be between about 2 microns and about 20 microns, whereas the width or opening diameter of the openings which will form the trenches 140 can preferably be between about 3 microns and about 30 microns.

Figure 16:
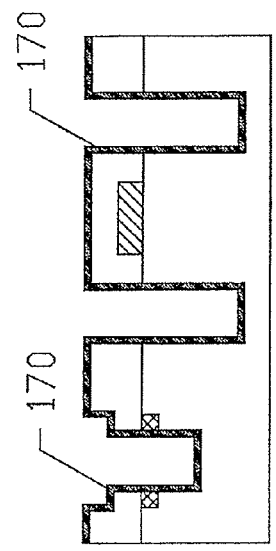
FIG. 16 shows a recess formed in the shallow trench of the structure of FIG. 15 according to the invention.

With reference to FIG. 16, a recess 160 can be formed in the trenches 150 which will form the capacitor(s). The recess 160 can be formed in the same way as was discussed above in reference to FIG. 5. Again, by way of non-limiting example, the width or opening diameter of the recess 160 can preferably be between about 4 microns and about 30 microns, whereas the depth of the recess can preferably be between about 0.5 microns and about 2 microns.

Figure 17:
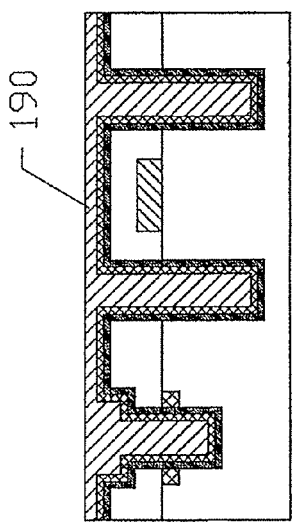
FIG. 17 shows the structure of FIG. 16 after a first conductive film is formed in the trenches according to the invention.

With reference to FIG. 17, a first conductive or metal film 170 is then formed in the trenches 140 and 150. The film 170 can be formed in the same way and have the same material as was discussed above in reference to FIG. 6. Again, by way of non-limiting example, the thickness of the first metal film 170 can preferably be between about 1,000 Å (angstroms) and about 5,000 Å.

Figure 18:
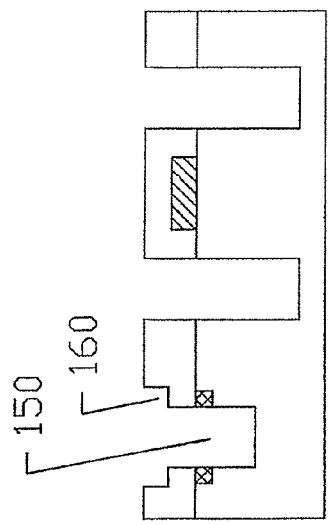
FIG. 18 shows the structure of FIG. 17 after a dielectric film is formed in the trenches according to the invention.

With reference to FIG. 18, a dielectric film 180 is then formed in the trenches 140 and 150 over the film 170. The film 180 can be formed in the same way and have the same material as was discussed above in reference to FIG. 7. Again, by way of non-limiting example, the thickness of the film 180 can preferably be between about 100 Å (angstroms) and about 500 Å or less.

Figure 19:
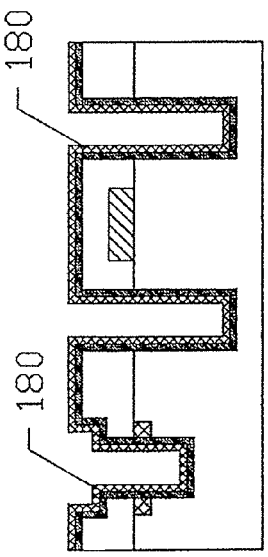
FIG. 19 shows the structure of FIG. 18 after a second conductive film is formed in the trenches according to the invention.

With reference to FIG. 19, a second conductive or metal film 190 is then formed in the trenches 140 and 150 over the film 180. The film 190 can be formed in the same way and have the same material as was discussed above in reference to FIG. 8. Again, by way of non-limiting example, the second metal film 190 preferably completely or substantially fills the trenches 140 and 150 and can be applied to a thickness over layer 130 of a few microns or less.

Figure 20:
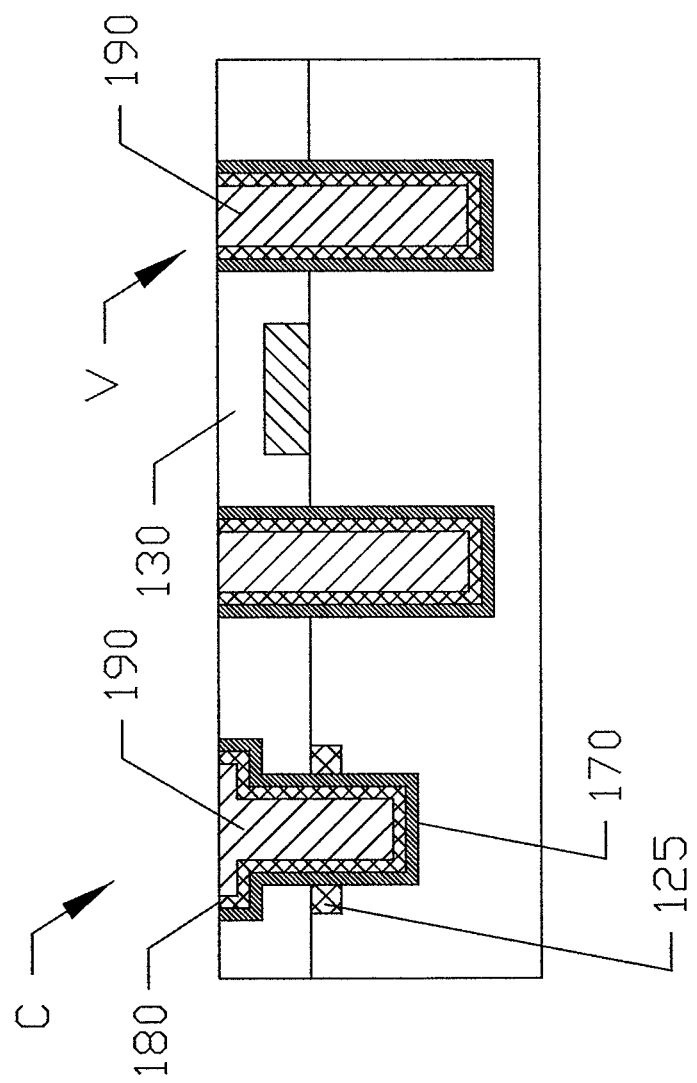
FIG. 20 shows the structure of FIG. 19 after the upper or front side surface of the structure is polished to form the vias and a capacitor according to the invention.

With reference to FIG. 20, the front side of the structure of FIG. 19 is then subjected to a material removing step, e.g., a polishing step, which removes the metal film 190 over the layer 130. This step can be accomplished in the same way as was discussed above in reference to FIG. 9. At this point, a capacitor C and vias V are formed. However, unlike the previous embodiment, the capacitor C is in electrical connection with the doped region 125 (which functions as a contact or electrode) via the first film 170 of the capacitor C. Again, by way of non-limiting example, the thickness of the layer 130 which remains after polishing can preferably be between about 2,000 Å (angstroms) and about 10,000 Å.

Figure 21:
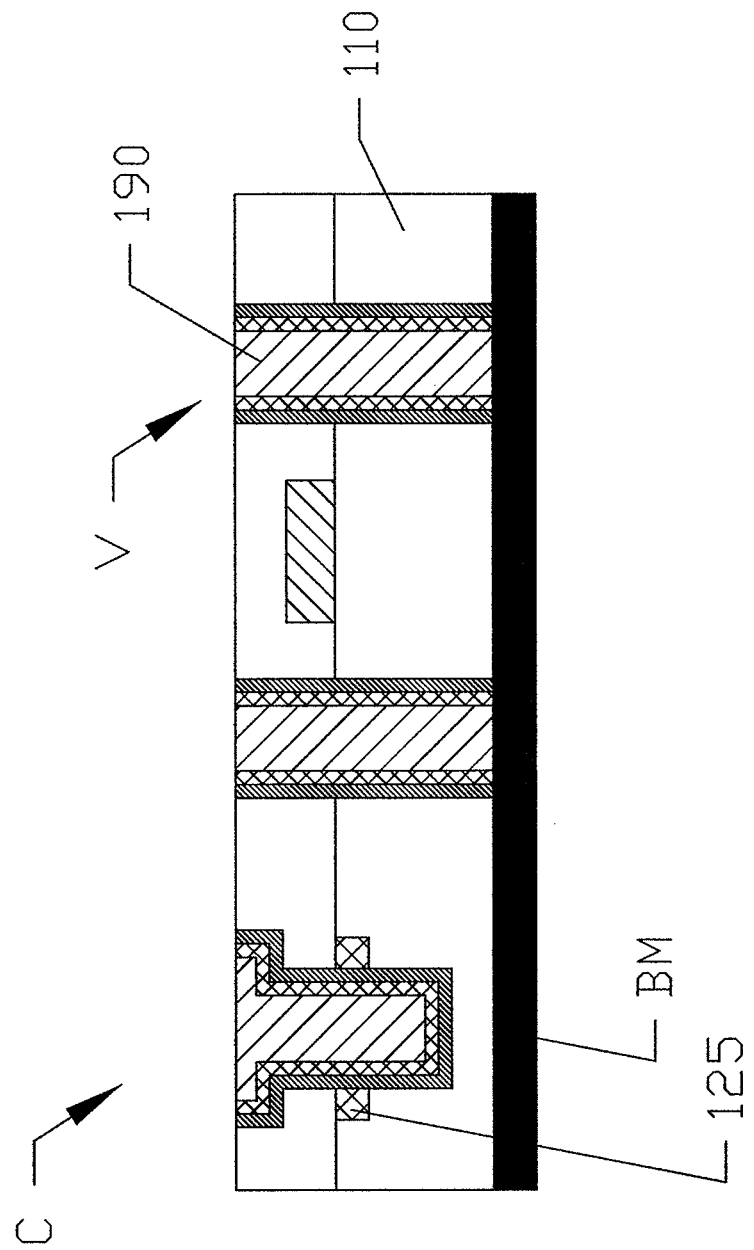
FIG. 21 shows the structure of FIG. 20 after a the back surface of the structure is ground and after a backside metal layer is applied thereto according to the invention.

With reference to FIG. 21, the back side of the structure of FIG. 20 is subjected to a material removing step, e.g., a grinding step, which removes an amount of the substrate 110. This step can be accomplished in the same way as was discussed above in reference to FIG. 10. As a result, the vias V become electrically connected to the back side metal layer BM, while the capacitor C remains electrically insulated therefrom. The structure in FIG. 21 can then be subjected to further processing steps in order to form a completed semiconductor structure. Such processing will then typically provide electrical connections between the capacitor C and the vias V and structures which will be formed over the layer 130.

Figure 22:
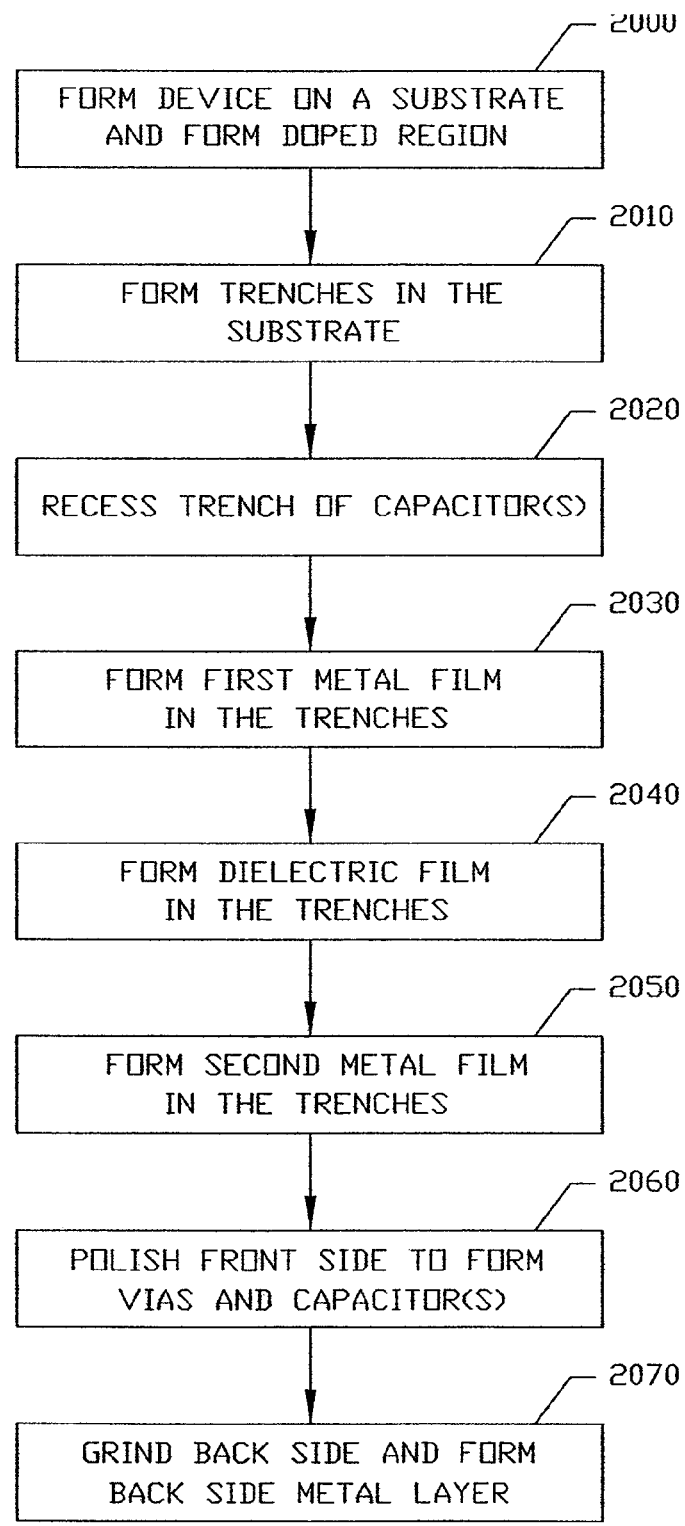
FIG. 22 shows a flow diagram illustrating a non-limiting method of making a semiconductor structure of FIGS. 12-21 according to the invention.

With reference to FIG. 22, there is shown a non-limiting method of making a semiconductor structure of FIGS. 12-21 which includes the step of forming a device and a doped region on a substrate in step 2000 (see also FIG. 13). Trenches are then formed in the structure which extend into the substrate in step 2010 (see also FIG. 15). This is followed by forming a recess in the shallow trench in step 2020 (see also FIG. 16). Thereafter, a first metal film is formed in the trenches in step 2030 (see also FIG. 17). Then, a dielectric film is formed in the trenches over the first metal film in step 2040 (see also FIG. 18). This is followed with a second metal film being formed in the trenches over the dielectric film in step 2050 (see also FIG. 19). Next, the front side of the structure is polished so as to form the capacitor and the vias in step 2060 (see also FIG. 20). Finally, the back side of the structure is ground and a back side metal layer is applied thereto in step 2070 (see also FIG. 21).

Figure 23:
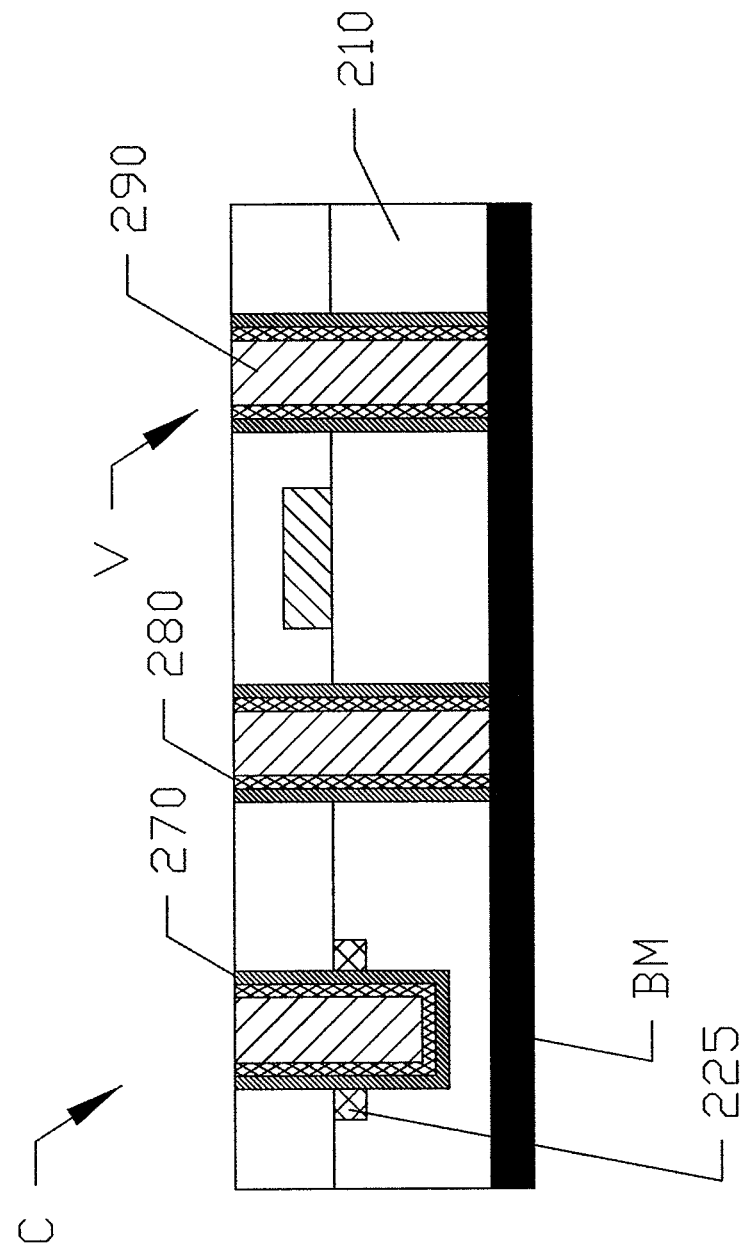
FIG. 23 shows a structure similar to that of FIGS. 12-21 except that no recess is formed in the shallow trench according to the invention.

With reference to FIG. 23, there is shown a third non-limiting embodiment of a semiconductor structure formed in the same manner as the embodiment of FIGS. 12-22 except that the step of forming the capacitor trench (i.e., the step shown in FIG. 16) is omitted. This structure thus includes vias V electrically connected to the back side metal layer BM and a capacitor C. Each of the vias V and the capacitor C are formed with a first metal film 270, a dielectric film 280 and a second metal film 290. A doped region 225 provides a conductive path to the capacitor C via the first metal film 270. The structure in FIG. 23 can then be subjected to further processing steps in order to form a completed semiconductor structure. Such processing will then typically provide electrical connections between the capacitor C and the vias V and structures which will be formed over the layer covering the substrate 210.

Figure 24:
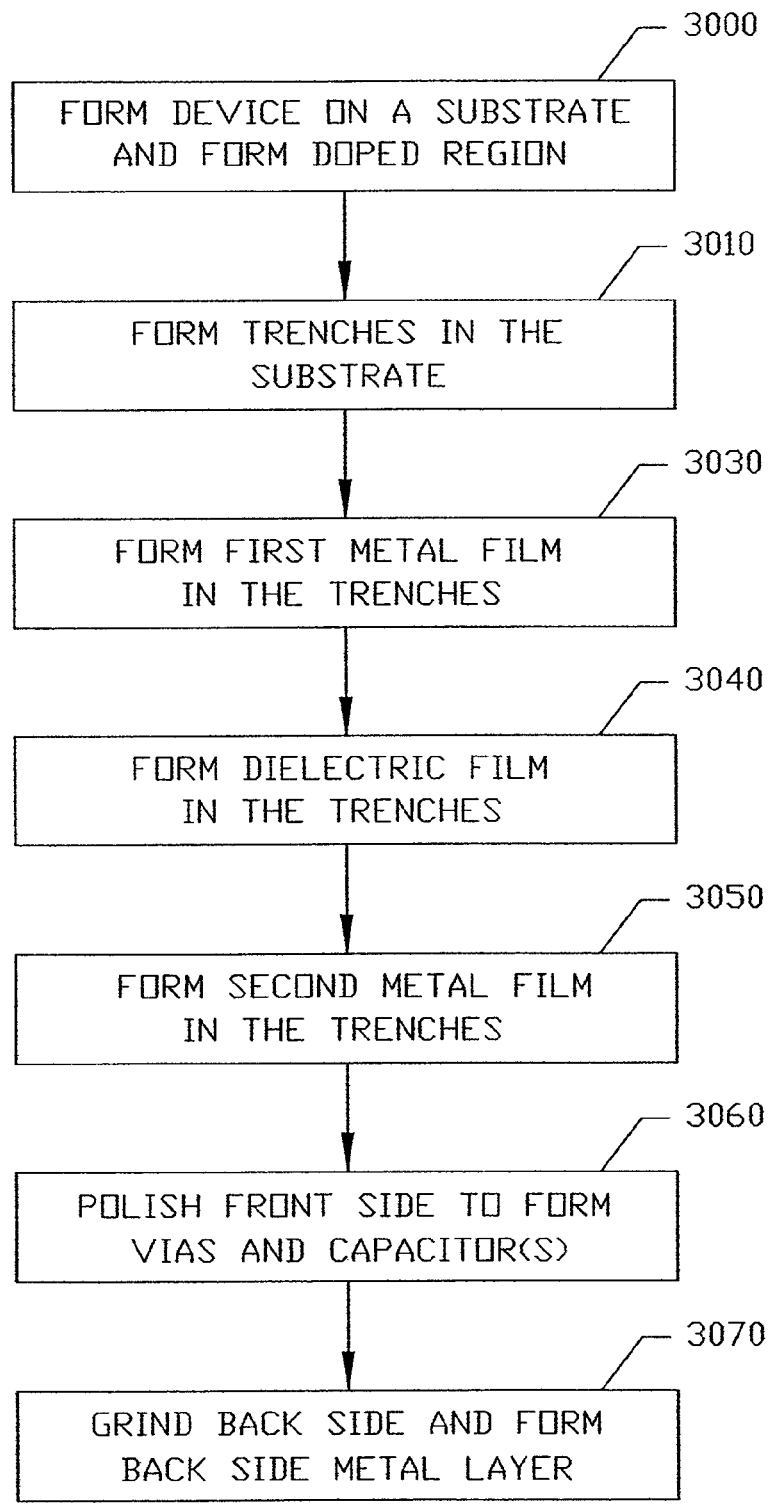
FIG. 24 show a flow diagram illustrating a non-limiting method of making a semiconductor structure of FIG. 23 according to the invention.

With reference to FIG. 24, there is shown a non-limiting method of making a semiconductor structure of FIG. 23 which includes the step of forming a device and a doped region on a substrate in step 3000. Trenches are then formed in the structure which extend into the substrate in step 3010. Thereafter, a first metal film is formed in the trenches in step 3030. Then, a dielectric film is formed in the trenches over the first metal film in step 3040. This is followed with a second metal film being formed in the trenches over the dielectric film in step 3050. Next, the front side of the structure is polished so as to form the capacitor and the vias in step 3060. Finally, the back side of the structure is ground and a back side metal layer is applied thereto in step 3070.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Design Flow

Figure 25:
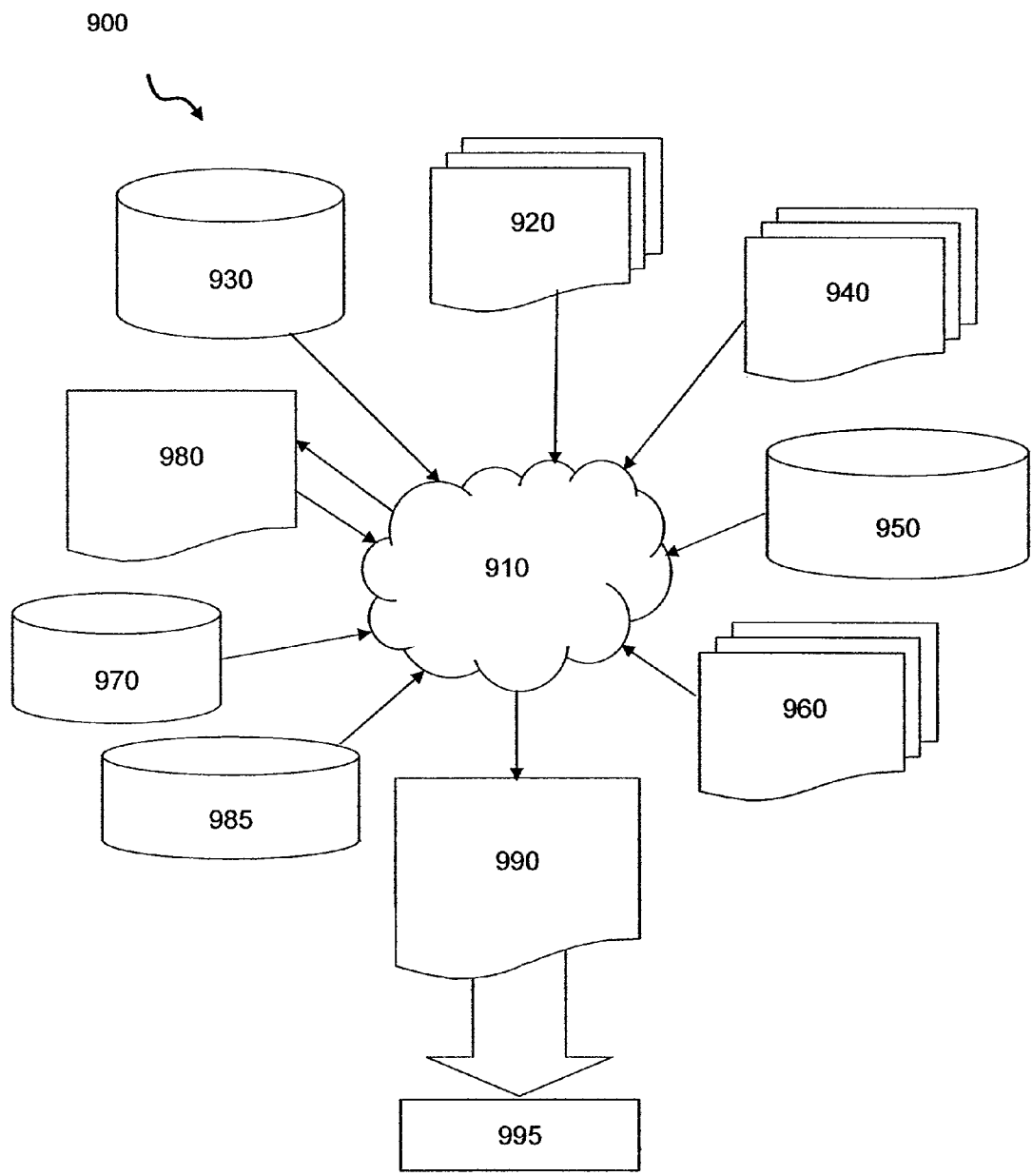
FIG. 25 is a flow diagram of a design process used in semiconductor design, manufacturing, and/or testing.

FIG. 25 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. (Altera is a registered trademark of Altera Corporation in the United States, other countries, or both. Xilinx is a registered trademark of Xilinx, Inc. in the United States, other countries, or both.) Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-10, 12-21 and 23 in the form of schematics or HDL, a hardware-description language (e.g., VERILOG®, Very High Speed Integrated Circuit (VHSIC) Hardware Description Language (VHDL), C, etc.). (VERILOG is a registered trademark of Cadence Design Systems, Inc. in the United States, other countries, or both.) Design structure 920 may be contained on one or more machine readable medium. For example, design structure 920 may be a text file or a graphical representation of an embodiment of the invention as shown in FIGS. 1-10, 12-21 and 23. Design process 910 preferably synthesizes (or translates) an embodiment of the invention as shown in FIGS. 1-10, 12-21 and 23 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-10, 12-21 and 23, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-10, 12-21 and 23. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A semiconductor structure, comprising:
   a capacitor arranged in a first trench formed in a substrate;
   a transistor on a top surface of the substrate opposite a back side of the substrate; and
   a via arranged in a second trench formed in the substrate,
   wherein the first and second trenches have different depths in the substrate,
   the via and the capacitor comprise a first conductive film, a second conductive film, and a dielectric film arranged there-between,
   the via is a through wafer via,
   the second conductive film is centrally inside the dielectric film and the first conductive film in the via,
   the first conductive film and the second conductive film in the via each contacts a back side metal layer of the substrate, and
   the back side metal layer extends continuously across the entire back side of the substrate.

2. The structure of claim 1, wherein the first conductive film and the second conductive film comprise substantially the same material.

3. The structure of claim 1, wherein the first trench is arranged at a first depth in the substrate.

4. The structure of claim 1, further comprising a recess arranged in the first trench and the substrate.

5. The structure of claim 4, wherein the capacitor is arranged in the first trench and the recess.

6. The structure of claim 4, wherein:
   the first trench is arranged at a first depth in the substrate; and
   the recess is arranged at a depth lesser than the first depth, in the substrate, and is arranged at a width greater than a width of the first trench.

7. The structure of claim 4, wherein:
   the substrate comprises an isolation layer;
   a depth of the recess is less than a depth of the isolation layer, in the substrate; and
   surfaces of the isolation layer, the first conductive film, the second conductive film, and the dielectric film are coplanar.

8. The structure of claim 1, wherein the capacitor is at least one of:
   a MIM capacitor;
   a high density capacitor; and
   a greater than about 100 fF/$\mu$m$^2$ capacitor.

9. The structure of claim 1, further comprising a dielectric layer on the top surface of the substrate,
   wherein the via extends entirely through the dielectric layer and entirely through the substrate, and
   the capacitor extends entirely through the dielectric layer and only partially into the substrate.

10. The structure of claim 1 wherein each of the first conductive film, the dielectric film, and the second conductive film extends from a top surface of the via to a bottom surface of the via.

11. The structure of claim 1, wherein:
    the via comprises the first conductive film and the dielectric film surrounding the second conductive film.

12. The structure of claim 1, wherein, in the via, each of the first conductive film, the dielectric film, and the second conductive film contacts the back side metal layer of the substrate.

13. The structure of claim 1, further comprising a doped region in the substrate.

14. The structure of claim 13, wherein the capacitor extends through the doped region in the substrate.

15. The structure of claim 1, further comprising:
a doped region in the substrate; and
a dielectric layer over the transistor, the doped region, and the substrate,
wherein:
  the capacitor extends through the dielectric layer and only partially into the substrate;
  the via extends completely through the dielectric layer and the substrate;
  the doped region extends on two sides of the capacitor; and
  a width of a pedestal region of the capacitor in the dielectric layer is greater than a width of the capacitor in the substrate.

16. The structure of claim 1, wherein the substrate is a Si substrate.

17. The structure of claim 1, wherein the first conductive film, the second conductive film, and the dielectric film completely fill the first trench and the second trench.

18. A semiconductor structure, comprising:
a capacitor arranged in a first trench formed in a Si substrate;
a via arranged in a second trench formed in the Si substrate;
a back side metal layer on a back side of the substrate; and
a transistor on a top surface of the substrate opposite the back side of the substrate,
wherein the first and second trenches have different depths in the Si substrate,
wherein the via and the capacitor comprise a first conductive film, a second conductive film, and a dielectric film arranged there-between, and the first conductive film, the second conductive film, and the dielectric film completely fill the first trench and the second trench,
wherein the back side metal layer extends continuously across the entire back side of the substrate and contacts the first conductive film and the second conductive film in the via,
wherein the first trench is arranged at a first depth in the Si substrate, and
wherein the second trench is arranged at a second depth greater than the first depth, in the Si substrate.

* * * * *